(12) United States Patent
Ichinose

(10) Patent No.: US 7,930,665 B2
(45) Date of Patent: Apr. 19, 2011

(54) METHOD AND PROGRAM FOR DESIGNING SEMICONDUCTOR INTEGRATED CIRCUIT

(75) Inventor: Shigenori Ichinose, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 538 days.

(21) Appl. No.: 11/865,242

(22) Filed: Oct. 1, 2007

(65) Prior Publication Data

US 2008/0104562 A1    May 1, 2008

(30) Foreign Application Priority Data

Oct. 31, 2006 (JP) .................................. 2006-296098

(51) Int. Cl.
*G06F 17/50* (2006.01)
(52) U.S. Cl. .......................................... 716/113; 716/51
(58) Field of Classification Search .......................... None
See application file for complete search history.

(56) References Cited

U.S. PATENT DOCUMENTS

| | | | |
|---|---|---|---|
| 5,365,463 A * | 11/1994 | Donath et al. .................. 703/19 |
| 7,131,082 B2 * | 10/2006 | Tsukiyama et al. ............... 716/4 |
| 7,219,320 B2 * | 5/2007 | Kawano et al. ................... 716/6 |
| 7,401,307 B2 * | 7/2008 | Foreman et al. ............... 716/113 |
| 7,487,475 B1 * | 2/2009 | Kriplani et al. ................ 716/136 |
| 7,669,154 B2 * | 2/2010 | Hosono ............................ 716/6 |
| 7,673,260 B2 * | 3/2010 | Chen et al. ........................ 716/4 |
| 2004/0254776 A1 * | 12/2004 | Andou ............................ 703/19 |
| 2005/0081171 A1 | 4/2005 | Kawano et al. .................... 716/6 |

FOREIGN PATENT DOCUMENTS

| | | |
|---|---|---|
| JP | 9-311877 A | 12/1997 |
| JP | 2001-168200 A | 6/2001 |
| JP | 2005-79162 A | 3/2005 |
| JP | 2005-122298 | 5/2005 |
| WO | 03/060776 | 7/2003 |

OTHER PUBLICATIONS

Japanese Notice of Rejection Grounds, Partial English-language translation, mailed Jan. 18, 2011 for corresponding Japanese Patent Application No. 2006-296098.

* cited by examiner

*Primary Examiner* — Leigh Marie Garbowski
(74) *Attorney, Agent, or Firm* — Fujitsu Patent Center

(57) ABSTRACT

The method of designing a semiconductor integrated circuit of the embodiment is characterized in: reading from a memory unit a fundamental property value of a cell constituting a semiconductor integrated circuit in a case in which a variation of a property value is not taken into consideration, and reading from a memory unit variation coefficients of the property value of the cell corresponding to a dimension of a transistor constituting the cell; and performing a static timing analysis on the semiconductor integrated circuit by using the read variation coefficients and fundamental property value.

11 Claims, 20 Drawing Sheets

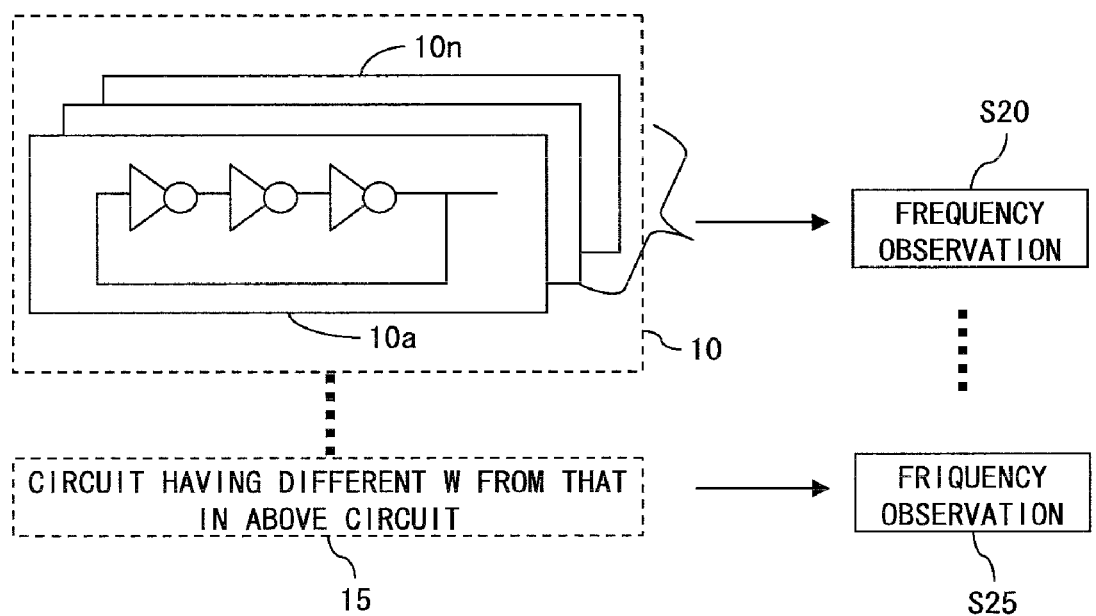
F I G. 8

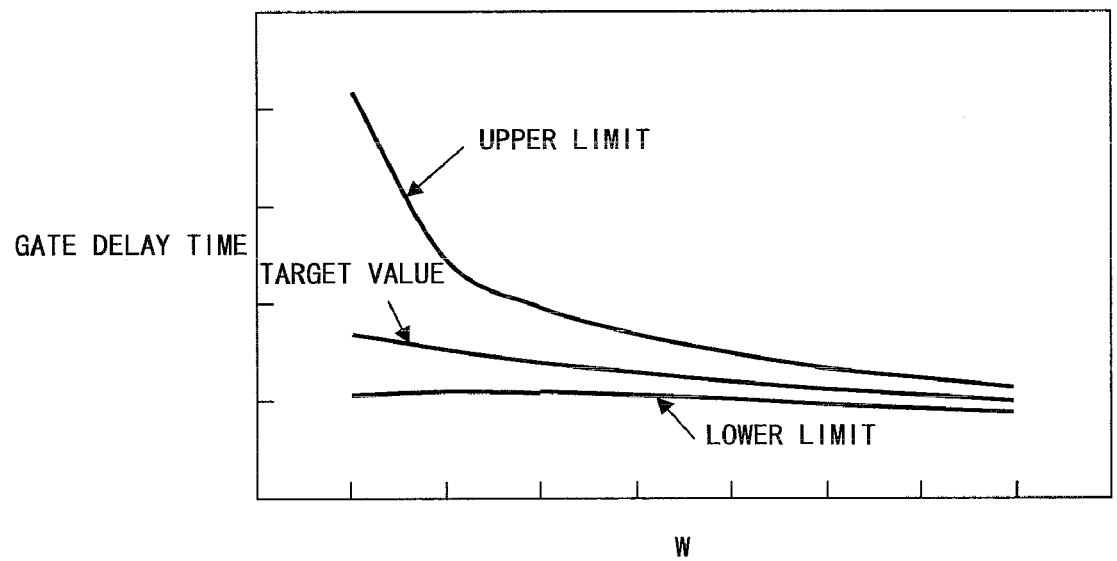
F I G. 10

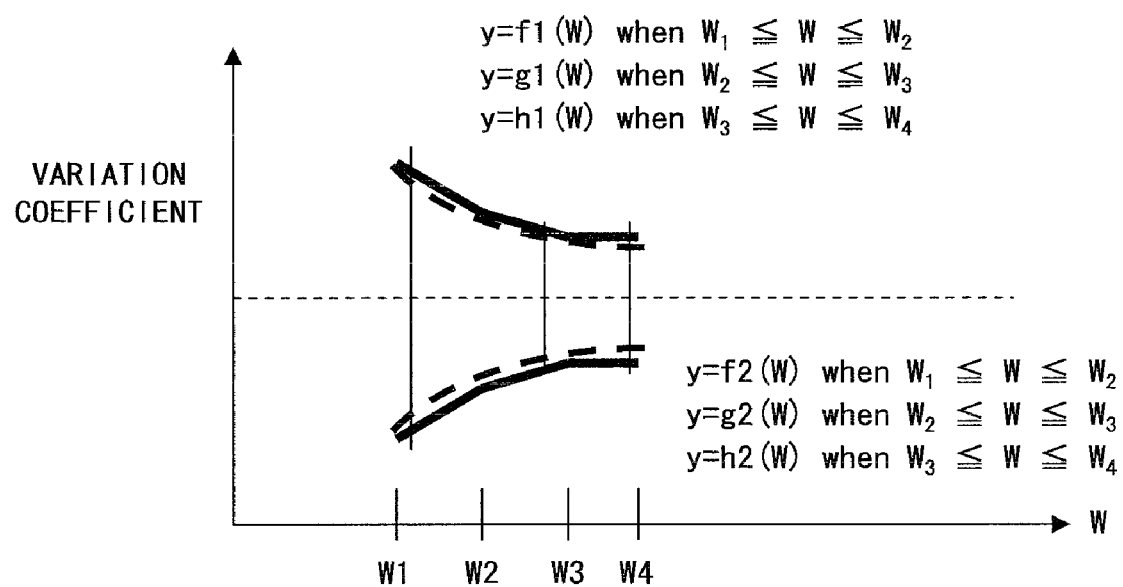
F I G. 1 2

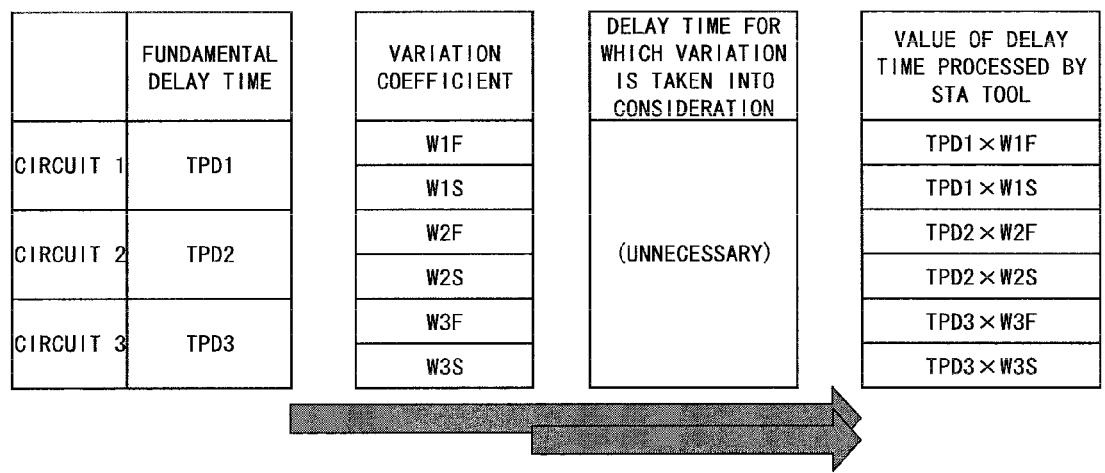
F I G. 1 4

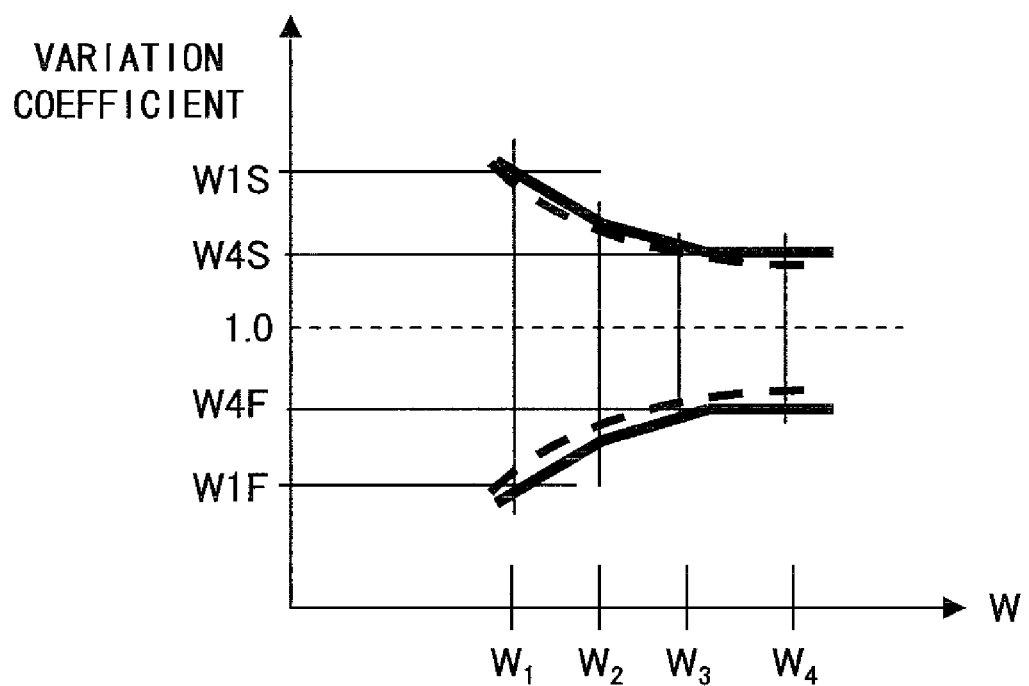
F I G. 18

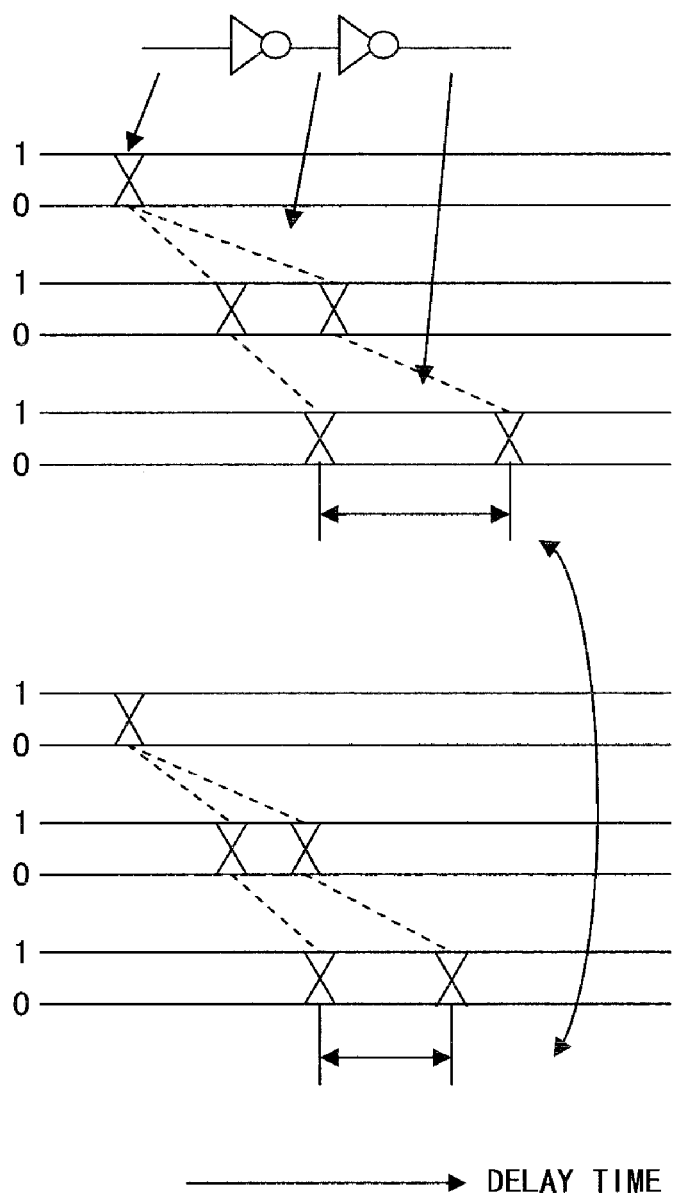
F I G. 1 9

METHOD AND PROGRAM FOR DESIGNING SEMICONDUCTOR INTEGRATED CIRCUIT

CROSS REFERENCE TO RELATED APPLICATION

This application is based upon and claims the benefit of priority from the prior Japanese Patent Application No. 2006-296098 filed on Oct. 31, 2006, the entire contents of which are incorporated herein by reference.

BACKGROUND

1. Field

The embodiment relates to a method of designing and producing semiconductor integrated circuits, and particularly to a method and a program designing semiconductor integrated circuits.

2. Description of the Related Art

Static timing analysis (STA) is conventionally employed as a method of verifying timing in semiconductor integrated circuits (such as an LSI circuit). In STA, timing in circuits is verified on the basis of delay times that are respectively assigned to cells that constitute a semiconductor integrated circuit.

Factors that affect variations in signal propagation delay in LSIs include (1) variations in process properties such as transistor properties of transistors that constitute LSIs, (2) variations in power supply voltage caused by a voltage drop inside the chip, and (3) variations in temperature inside the chip. These variations are called on-chip variations (OCV). It is very difficult to strictly take each OCV into consideration, and in conventional STA, variations of property values (such as delay time, for example) are expressed by uniform variation coefficients for respective cells that constitute LSIs in order to verify whether or not the semiconductor integrated circuit can operate normally. As the uniform variation coefficients, relatively large values are used to cover all the cases.

However, as processes have been miniaturized in recent years, variations in dimensions such as the gate width of transistors that constitute a cell become greater, and the timing margins on designs become greater when uniform variation coefficients are used for each cell, which is problematic in view of design.

FIGS. 1 and 2 show the conventional problem. FIG. 1 shows an example of a design of a transistor. In FIG. 1, the length of the gate is L, and the width of the gate is W that faces the active areas Many properties of transistors are determined by this gate width W.

FIG. 2 shows the relationship between the gate width W and the on-state current that is one of the transistor properties. When the gate width W becomes small, the range of the variation coefficient (ratio to the target value) expressing the variations of the property value (the interval between the upper and lower limits) becomes wider and when the variation coefficient for the small gate width is used uniformly, the timing margins on designs of the large gate width becomes too great, which is problematic.

Patent Document 1 discloses, as a conventional technique of timing analysis, a method of calculating a delay time; with this method timings can be efficiently verified by calculating a correction value for the variation coefficients on the basis of the function by which the propagation delay time can be approximated as the propagation delay time caused by variations in an actual chip in accordance with the number of cell stages in a signal path, and by calculating the propagation delay time while taking into consideration the corrected variation coefficients.

Patent Document 2 discloses, as another conventional technique, a timing analysis device that can perform accurate timing analysis by calculating the OCV coefficient that has been obtained by taking into consideration the number of cell stages on the basis of the idea that an increased number of cell stages reduces the range of variations of, for example, the delay time because the variations in the cell property are in accordance with the normal distribution.

However, even when these conventional techniques are used, there remains a problem that cannot be solved: the design has further difficulties due to variations in the transistor's dimensions (such as gate width) that will likely become greater as processes are miniaturized.

Patent Document 1
Republication of Patent No. WO2003/060776 "METHOD AND SYSTEM FOR CALCULATING DELAY TIME IN SEMICONDUCTOR INTEGRATED CIRCUIT"
Patent Document 2
Japanese Patent Application Publication No. 2005-122298 "DEVICE, METHOD, AND PROGRAM FOR ANALYZING TIMING"

SUMMARY

The embodiment provides that a method of designing a semiconductor integrated circuit including, reading from a memory unit a fundamental property value of a cell constituting a semiconductor integrated circuit in a case in which variations of a property value are not taken into consideration, and a pair of variation coefficients indicating a variation range of the property value of the cell corresponding to one of the dimensions of a transistor constituting the cell, and performing a static timing analysis on the semiconductor integrated circuit in accordance with the read variation coefficients and the fundamental property value.

BRIEF DESCRIPTION OF THE DRAWINGS

FIG. 8 shows a property examination performed on circuits using cells constituted of transistors with different gate widths;

FIG. 10 shows a relationship, obtained from the result of the property examination in FIG. 9, between delay time per gate and the gate width of a transistor;

FIG. 12 shows approximation expressions of variation coefficients obtained from the result shown in FIG. 11;

FIG. 14 shows a first example of data being relayed to the STA tool in the embodiment;

FIG. 18 shows the effect of timing margin reduction in the embodiment;

FIG. 19 is a first view showing the effect of delay time variation reduction in the embodiment.

DESCRIPTION OF THE PREFERRED EMBODIMENTS

Figure 1:
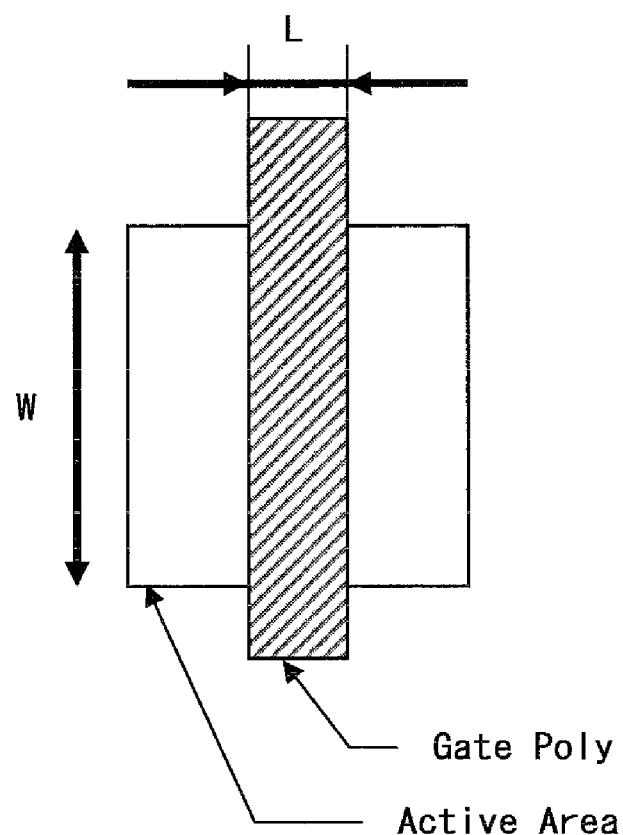
FIG. 1 shows an example of a pattern of a transistor.
Figure 2:
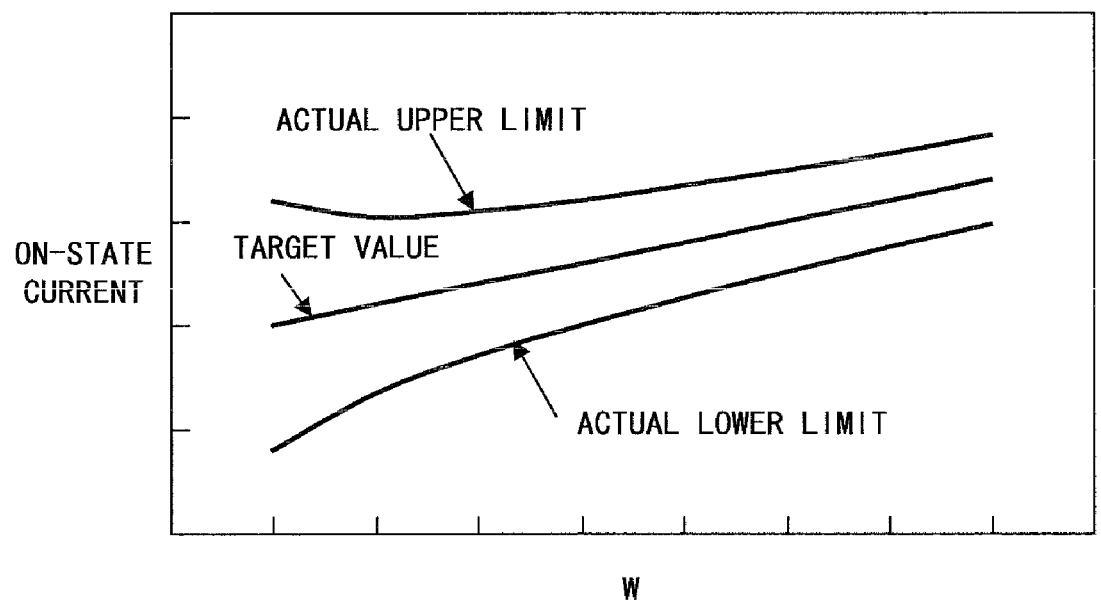
FIG. 2 shows the relationship between gate width W and on-state current that is one of transistor properties.
Figure 3A:
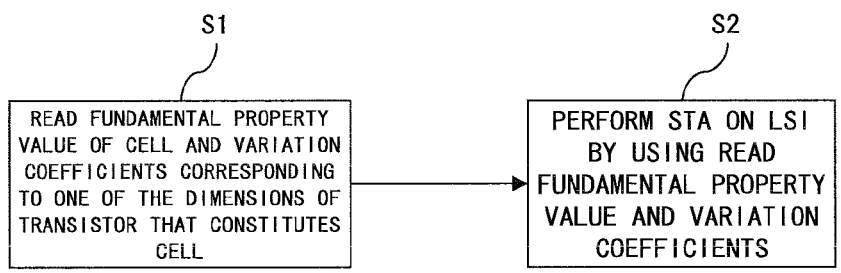
FIG. 3A is a principle function block diagram of a method of designing a semiconductor integrated circuit according to the embodiment.
Figure 3B:
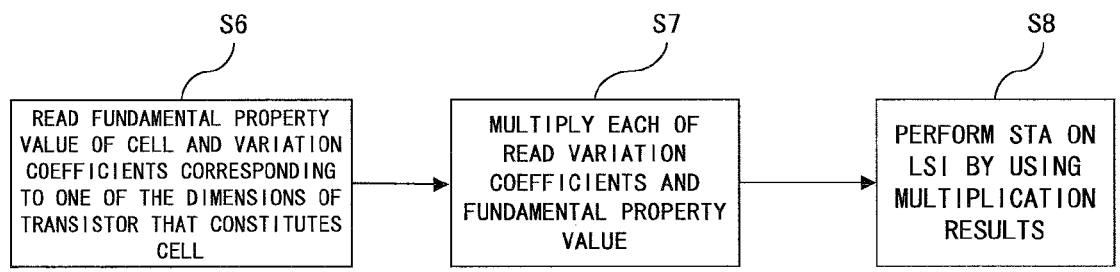
FIG. 3B is another principle function block diagram of a method of designing a semiconductor integrated circuit according to the embodiment.

FIGS. 3A and 3B are principle function block diagrams showing a method of designing a semiconductor integrated circuit according to the embodiment. FIG. 3A is a function block diagram showing a situation in which an STA tool for performing static timing analysis (STA) has the function of performing STA for the input of the fundamental property value of a cell in a case in which variations are not taken into consideration and variation coefficients of the cell. FIG. 3B is a function block diagram showing a situation in which the STA tool does not have a function of directly receiving the input of variation coefficients of respective cells and the STA tool has to receive the multiplication results between the fundamental property value and each of the variation coefficients of the cell.

In step S1 of a method of designing a semiconductor integrated circuit, shown in FIG. 3A, a fundamental property value of a cell used for a semiconductor integrated circuit when variation is not taken into consideration and a pair of variation coefficients indicating the variation range of a property value corresponding to one of the dimensions (such as gate width) of a transistor that constitute the cell are read from a memory unit, and static timing analysis on the semiconductor integrated circuit is performed in step S2 by using the read fundamental property value and the variation coefficients.

In step S6 of another method of designing a semiconductor integrated circuit, shown in FIG. 3B, similarly to step S1 shown in FIG. 3A, the fundamental property value of a cell and a pair of variation coefficients indicating the variation range of a property value are read from a memory unit, and each of the read variation coefficients and the read fundamental property value are multiplied with each other in step S7, and static timing analysis on a semiconductor integrated circuit is performed in step S8 by using the property values which are obtained as the results of the multiplication and for which the variation has been taken into consideration.

In the embodiment, it is possible that in step S1 shown in FIG. 3A or in step S6 shown in FIG. 3B, relational expressions, stored in a memory unit, expressing the relationship between dimensions of transistors and variation coefficients of property values of a cell constituted of the transistors will be read instead of the variation coefficients of the property values corresponding to the dimensions of the transistors that constitute the cell being directly read from the memory unit, the variation coefficients of the property values of the cell will be calculated, by using the relational expressions, corresponding to the dimensions of the transistors constituting the cell used for a semiconductor integrated circuit, and static timing analysis will be performed by using the variation coefficients and the fundamental property values which are read from the memory unit and in which variations are not taken into consideration in, for example, step S2 shown in FIG. 3A. In FIG. 3B, it is possible to perform multiplication between the calculated variation coefficient and the fundamental property value in step S7.

A design program according to the embodiment causes a computer to execute the design of semiconductor integrated circuits, the design employing the methods described in FIG. 3A or FIG. 3B.

As described above, in the embodiment, a fundamental property value, such as a fundamental delay time of a cell when the variations are not taken into consideration, is multiplied by each of the variation coefficients corresponding to one of the dimensions such as the gate width of a transistor constituting the cell, and static timing analysis on the semiconductor integrated circuit is performed.

According to the embodiment, uniform variation coefficients are not used as variations of property values such as the delay time of a cell, and static timing analysis is performed by using the values of the appropriate variation coefficients corresponding to dimensions such as the gate width of the transistors constituting the cell, and thereby a semiconductor integrated circuit is designed. Accordingly, circuits can be designed with a smaller timing margin than that in the case when variation coefficients that are too large are used. Accordingly, it is possible to develop and design products that can sufficiently utilize the performance of transistors, e.g., products that requires a high operation speed.

Figure 4:
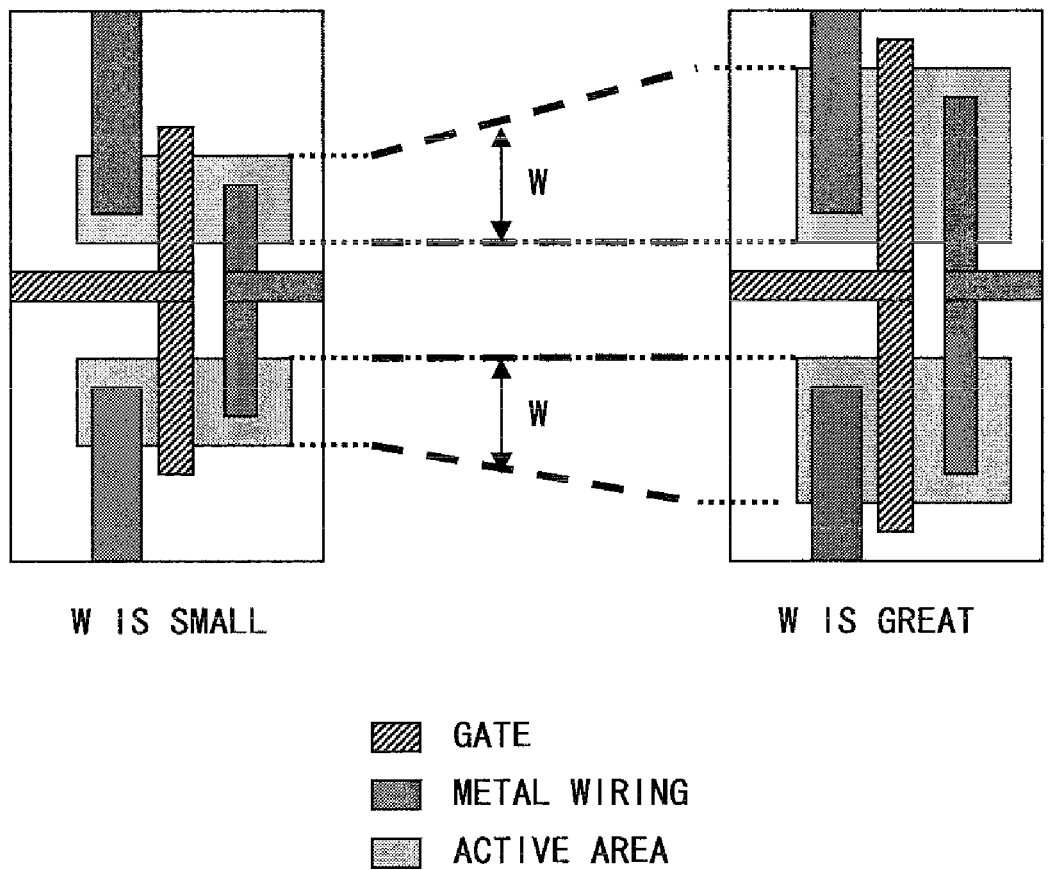
FIG. 4 shows an example of cells having inverter functions.

Next, an example of a cell used for a design method according to the embodiment is explained before the design method for semiconductor integrated circuits according to the embodiment is explained. FIG. 4 shows an example of an arrangement of cells that constitute a semiconductor integrated circuit. In this example, the function of these cells is an inverter. The gate width W of the transistor constituting the left inverter cell is small, and the gate width of the transistor constituting the right inverter cell is great. When an inverter has a transistor whose gate width is great, the inverter has a great driving ability, and an inverter cell constituted of a transistor having a suitable gate width in accordance with the circuit is used. In the case when, for example, there is a large number of fan-outs or there is a great wiring load, a transistor having a greater gate width W is used to enhance driving ability. In the explanation given hereinbelow, an embodiment is described by using the inverter as an example of a cell, and the delay time of an inverter as an example of a property value of a cell.

Figure 5:
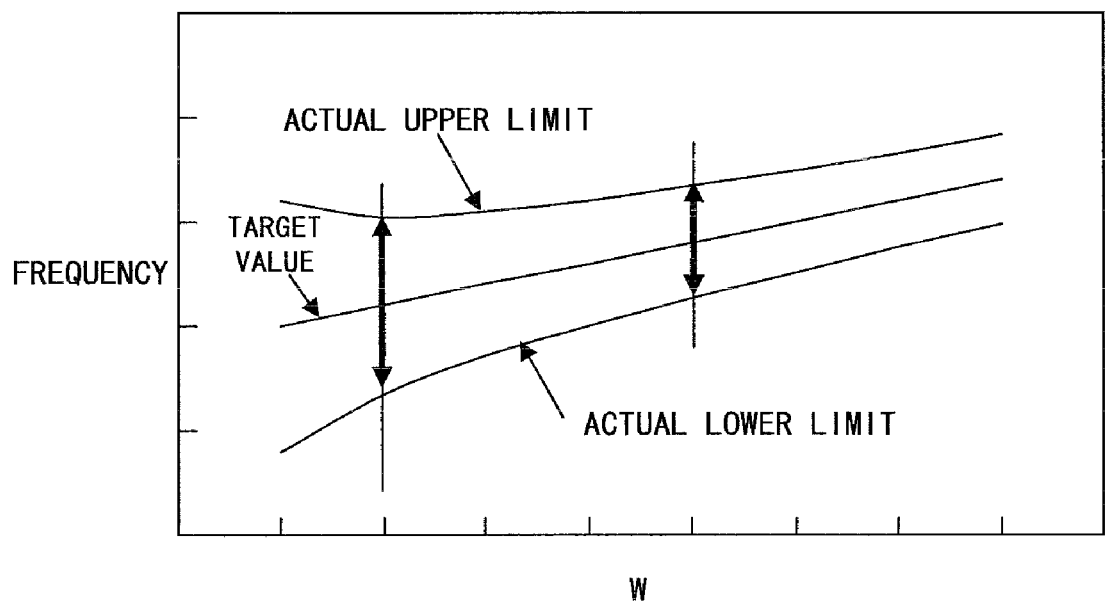
FIG. 5 shows the relationship between frequencies of a ring oscillator constituted of the inverter cells shown in FIG. 4 and the gate width W of the transistor.

FIG. 5 shows changes caused by the gate width W of a transistor having a frequency of a circuit constituted of an inverter cell in FIG. 4 such as a ring oscillator. When the gate width is either great or small, the frequency of the ring oscillator actually constituted of an inverter cell has variations around the target value; however, with a greater gate width W, the variation is smaller than with a smaller gate width W.

Figure 6:
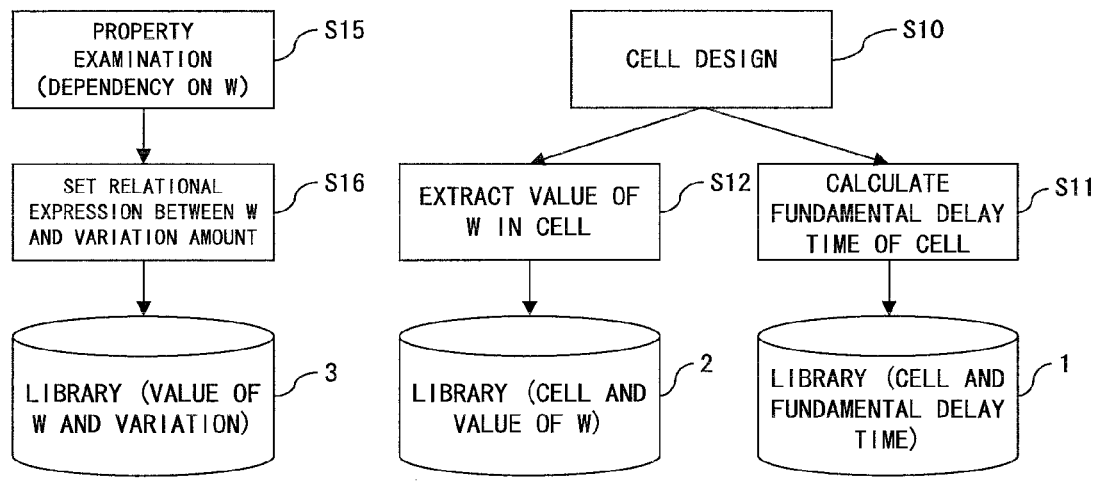
FIG. 6 shows a process flowchart for preparation phases in design of a semiconductor integrated circuit.

In the embodiment, the design is explained of semiconductor integrated circuits with variations in the gate width of a transistor that constitutes a cell such as an inverter taken into consideration. However, processes in preparation phases are performed in which various libraries used in the development phases of a product are created before the actual development phase of the product is performed. FIG. 6 shows a process flowchart for these preparation phases.

In FIG. 6, three libraries are created. Library 1 stores the pair of data including the cell and the fundamental delay time. In library 1, data of fundamental delay times is stored when variations of gate width W with respect to a plurality of inverter cells respectively constituted of transistors with different gate widths W are not taken into consideration.

Library 2 stores the pair of data including the cell and the value of gate width W. For example, the values of the gate widths W of transistors constituting an inverter cell corresponding to the names of a plurality of inverter cells respectively constituted of transistors with different gate widths W are stored.

In library 3, data of variation coefficients with respect to the value of W is stored. As will be described, this data is stored in the form of a function that provides a value of the variation coefficient corresponding to the interval of a value of W. In other words, the value of the variation coefficient with respect to a plurality of inverter cells having different values of gate width W is obtained through actual measurement, a function providing a relationship between the gate width W and the variation coefficient is obtained in accordance with the measured value, and the equation expressing the function is stored in library 3.

In FIG. 6, a cell design process is performed in step S10, and in step S11, the fundamental delay time of cells, e.g., the fundamental delay time for which variations of the gate width W are not taken into consideration, is calculated with respect to a plurality of inverter cells respectively constituted of transistors with different gate widths, and the result is stored in library 1. Also, in step S12, in accordance with the result of the cell design process in step S10, values of the gate width W of the transistors that constitute a plurality of inverter cells are extracted, and the values are stored in library 2.

In step S15, a property examination is made on a circuit constituted of the cells; specifically, dependence of the property on the gate width W of the transistor constituting the cell is examined. For example, the relationship between the gate width W and the frequency of the ring oscillator constituted of the respective inverter cells is obtained, and in step S16 the relational expression between a gate width W and a property such as a frequency is set, and the relational expression is stored in library 3. This property examination and relational expression will be described in FIGS. 8 through 12.

Figure 7:
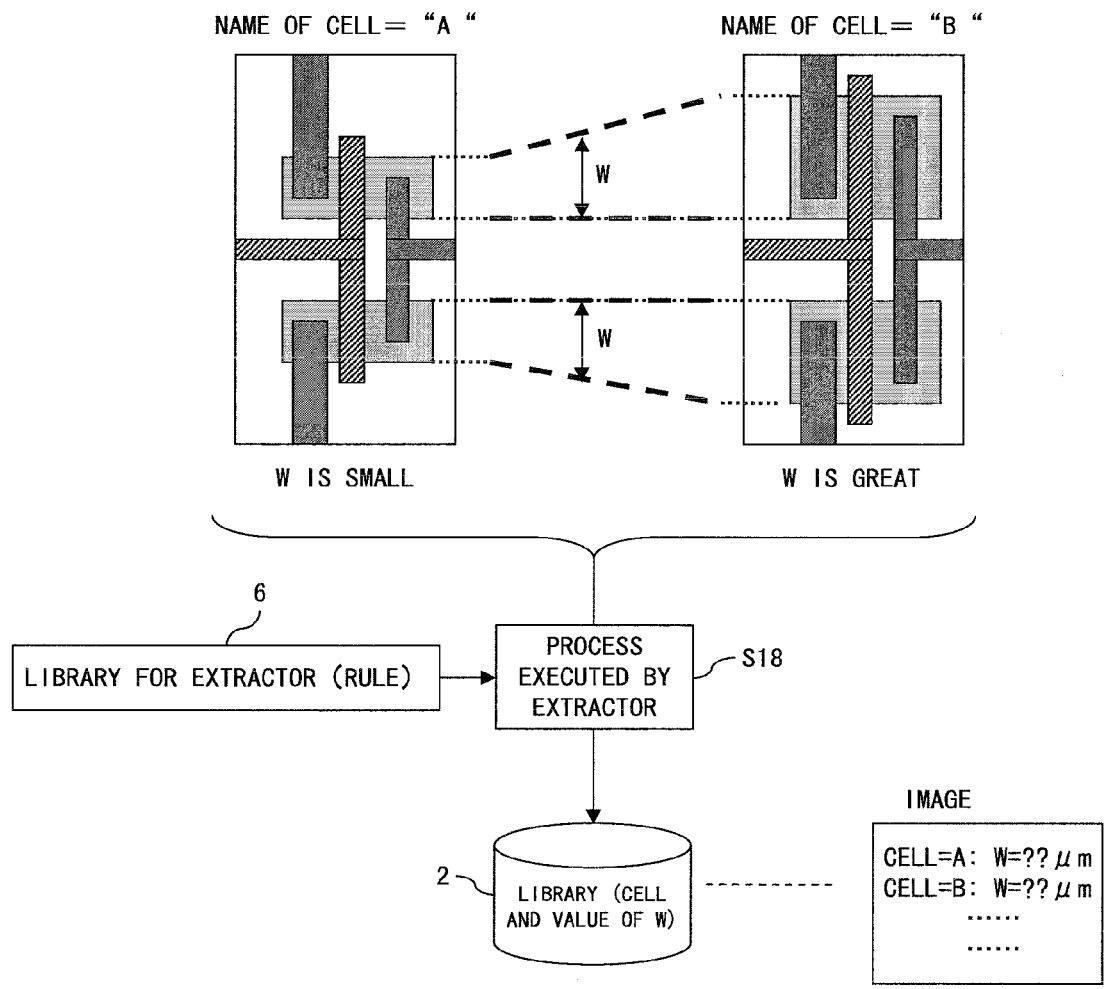
FIG. 7 shows a process of creating libraries for storing values of the gate width of a transistor constituting a cell corresponding to a name of the cell.

FIG. 7 shows the process in step S12 shown in FIG. 6; i.e., the extraction process of the value of the gate width W of the transistor constituting the cell. As described above, both of the cells explained in FIG. 4 are, in this example, inverter cells; the value of the gate width W of the transistor constituting each inverter cell is extracted in the process executed by an extractor in step S18 on the basis of a library (rule) 6 for extractors, and the value is stored in library 2. For example, the values of gate width W of the transistors respectively constituting the cells are stored with respect to cell name A and cell name B, respectively.

FIG. 8 shows a specific example of the property examination in step S15 shown in FIG. 6. In FIG. 8, frequency observation is performed in the ring oscillator constituted of the inverters with different gate widths W.

Specifically, the frequency observation is performed for ring oscillators $10_a$ through $10_n$ to which inverter cells constituted of the transistor having a gate width of, for example, $W_0$ are connected in three stages. The same frequency observation is sequentially performed (step S25) from many ring oscillators having a configuration in which inverter cells are connected in three stages, the inverter cells constituted of a transistor having the gate width of, for example, $W_1$, to many ring oscillators having a configuration in which inverter cells constituted of a transistor having a gate width $W_5$ are connected in three stages.

Figure 9:
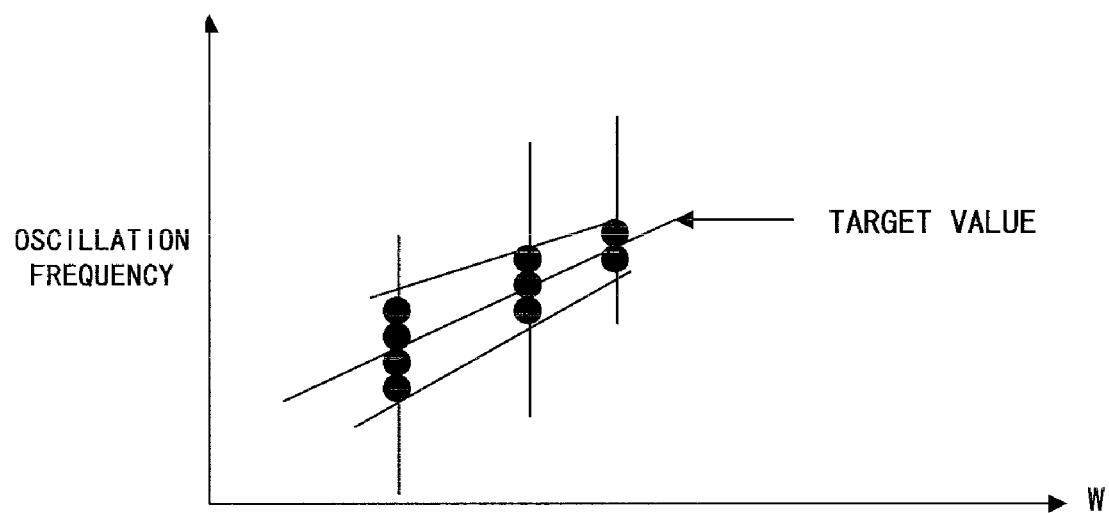
FIG. 9 is a graph showing the results of the property examination shown in FIG. 8 (relationship between the oscillation frequency of a ring oscillator and the gate width of a transistor)

FIG. 9 is a graph showing the results of the examination shown in FIG. 8. A plurality of measured points of oscillation frequency in accordance with a respective plurality of gate width W values are obtained, and lines (typically curves) showing the upper and lower limits of the measured points are obtained.

FIG. 10 shows the result of conversion from the relationship between the oscillation frequency of the ring oscillator shown in FIG. 9 and the gate width into the relationship between the delay time for each inverter cell (i.e., one stage of the gate) and the gate width of the transistor.

For example, before the input into the inverter of the first stage in the ring oscillator $10_a$ becomes H and the input into the inverter of the first stage again becomes H in, for example, FIG. 8, the signal has to circulate twice; accordingly, the oscillation frequency of the ring oscillator is given by the equation below.

Oscillation frequency=1/{(gate delay time×stage number of gate)×2}

In the ring oscillation circuit consisting of the gate (inverter cell) of the (n+1) stages, the gate delay time is given by the equation below.

Gate delay time=1/{oscillation frequency×(2n+2)}

FIG. 10 shows the range of the gate delay time corresponding to the gate width W of the transistor as the range of the upper limit value and the lower limit value, and also includes the target value.

Figure 11:
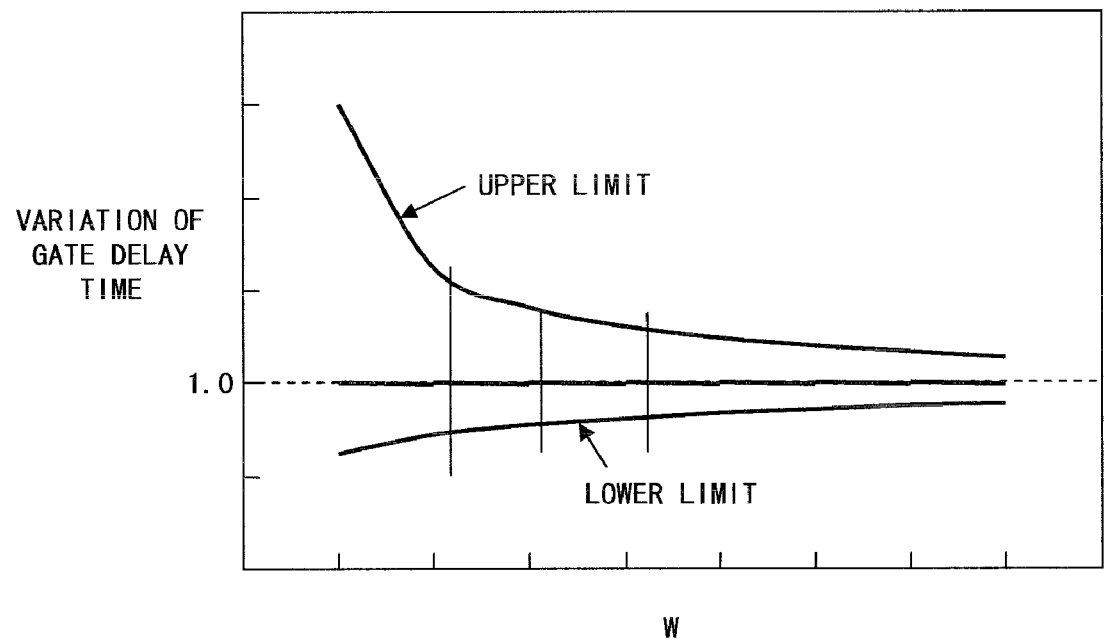
FIG. 11 is a graph of gate delay times when the result shown in FIG. 10 is normalized by a target value.

FIG. 11 is a graph obtained by normalizing as "1" the target value of the gate delay time of the result in FIG. 10. Via this normalization, the values of the variation coefficients expressing the variations of the gate delay time as the property of the inverter cell is obtained within the range of the upper limit variation coefficient and the lower limit variation coefficient.

FIG. 12 shows approximation functions of the upper and lower limit values of the variation coefficients. The functions expressing the upper and lower limits of the variation coefficients obtained in FIG. 11 are respectively obtained with respect to the intervals between $W_1$ and $W_2$, between $W_2$ and $W_3$, and between $W_3$ and $W_4$. The functions are stored in library 3 shown in FIG. 6 respectively as the functions f1 (W), g1 (W), and h1 (W) with respect to the upper limit of the variation coefficients, and as the functions f2 (W), g2 (W), and h2 (W) with respect to the lower limit value. Also, functions are respectively obtained for three intervals of W in this example; however, only one function can be obtained for all the intervals.

Figure 13:
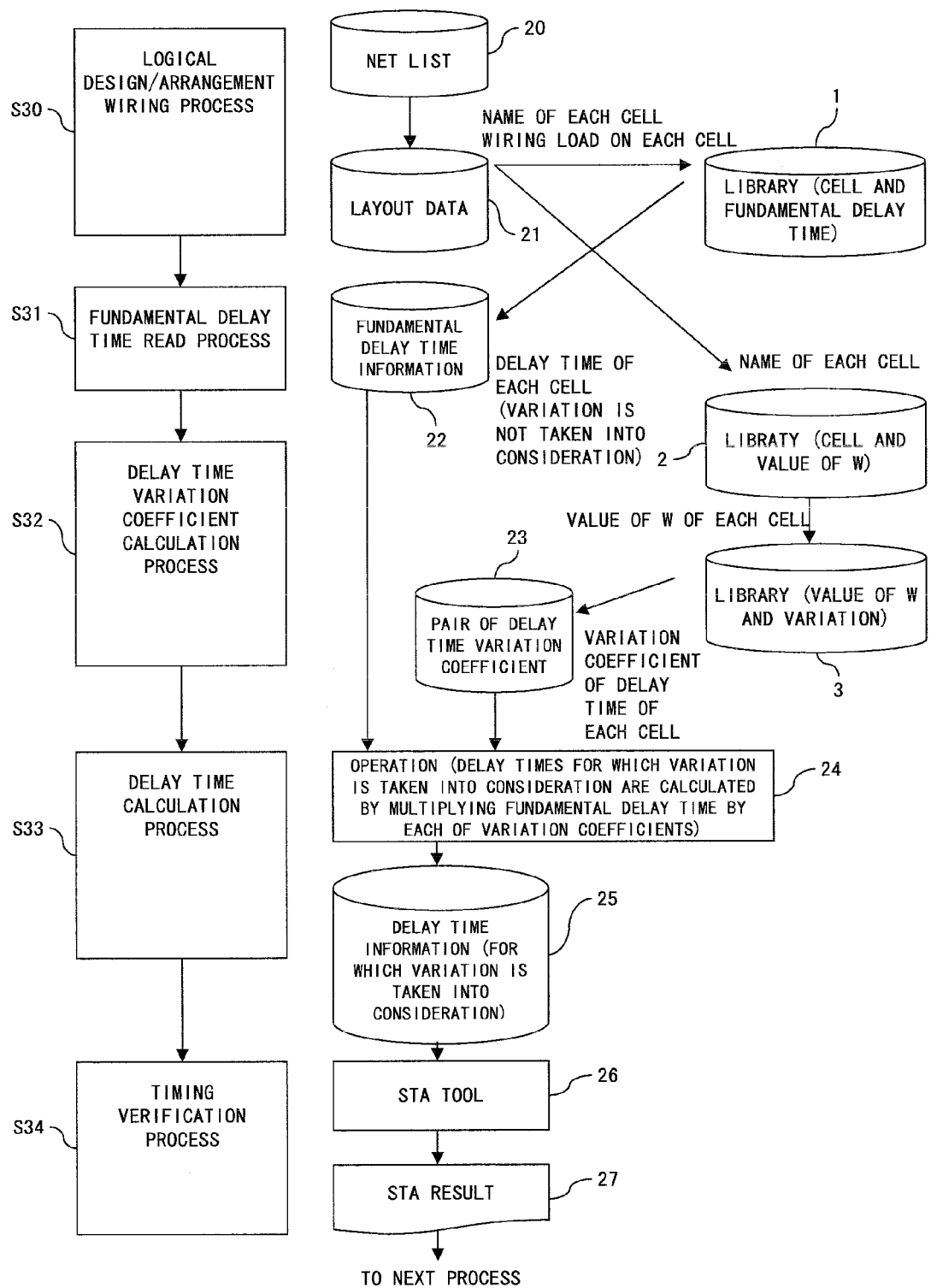
FIG. 13 is a process flowchart for a semiconductor integrated circuit design process in the development phase.

FIG. 13 is a flowchart for a semiconductor integrated circuit design process in a phase of the development of products after the process in a preparation phase, explained in FIG. 6, is finished. In step S30 in FIG. 13, the logical design/arrangement wiring process is performed, and layout data 21 is created from a net list 20. In response to names and the wiring load of respective cells, library 1 showing the relationship between the cells and the fundamental delay times and library 2 showing the relationship between the cells and the values of the gate width W of the transistors constituting the cells are created.

Next, in step S31, the fundamental delay time read process is executed In this process, the delay time of each cell for which variations are not taken into consideration is read from library 1, and fundamental delay time information 22 is created.

Next, in step S32, the process of calculating the delay time variation coefficients is executed. In this process, values of the gate width W of the transistors respectively constituting each cell (for example, cells A and B in FIG. 7) are obtained from library 2, and the variation coefficients for the delay times of the respective cells such as cells A and B, i.e., the upper and lower limit values thereof, are calculated by using the equations expressing the relationship between the variation coefficients and the gate width stored in library 3 in order to obtain a pair of delay time variation coefficients 23. As a matter of course, when the relationships between the gate width and the variation coefficients with respect to cells A and B are stored in the form of a table in, for example, library 3, the information in the table is read as it is.

Next, in step S33, the process of calculating the delay times when taking variations into consideration is performed. In this process, delay time information 25 for which variations are taken into consideration is obtained by respectively multiplying the fundamental delay time, i.e., the values of the delay time of each cell when the variations are not taken into consideration, and each of the pair of delay time variation coefficients 23 corresponding to the value of the gate width W of the transistor constituting each cell.

The delay time information 25 for which variations are taken into consideration is used to perform the timing verification process in step S34. Specifically, the delay time information 25 for which variations are taken into consideration is relayed to an STA (Static Timing Analysis) tool 26, a static timing analysis is performed, and an STA result 27 is obtained. Then, if this STA result is satisfactory, the process proceeds to the next step. When this result is not satisfactory, the processes from, for example, the logical design/arrangement wiring process in step S30 are repeated as necessary.

Although in FIG. 13 the delay times for which variations are taken into consideration are calculated in step S33 and the delay times are relayed to the STA tool 26, when the STA tool has the function of directly reading the pair of delay time variation coefficients 23 and the fundamental delay time information 22 for each cell, i.e., a delay time for each cell for which variations are not taken into consideration, the fundamental delay time information 22 and the pair of delay time variation coefficients 23 may be directly relayed to the STA tool 26 by skipping the process in step S33.

Figure 15:
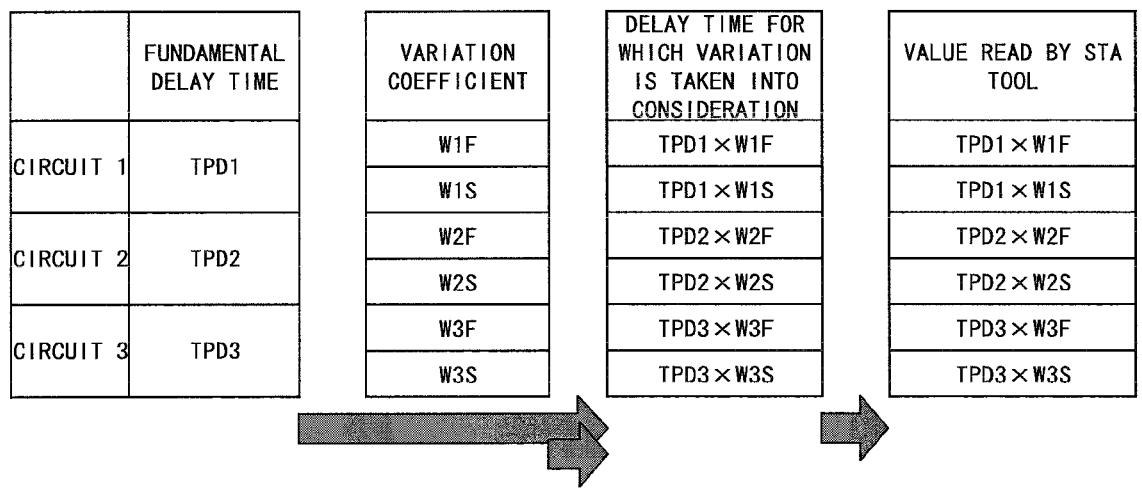
FIG. 15 shows a second example of data being relayed to the STA tool in the embodiment.
Figure 16:
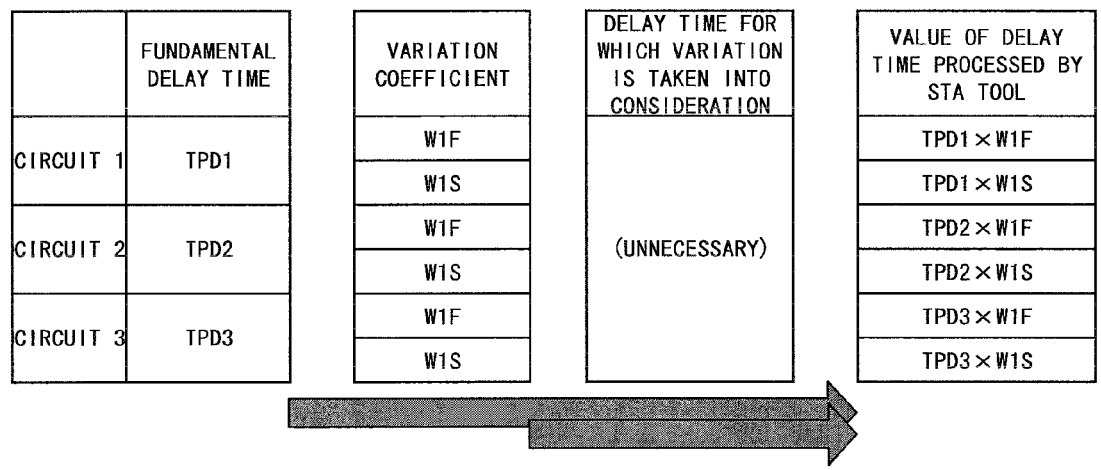
FIG. 16 shows a first example of data being relayed to the STA tool in a conventional design method.
Figure 17:
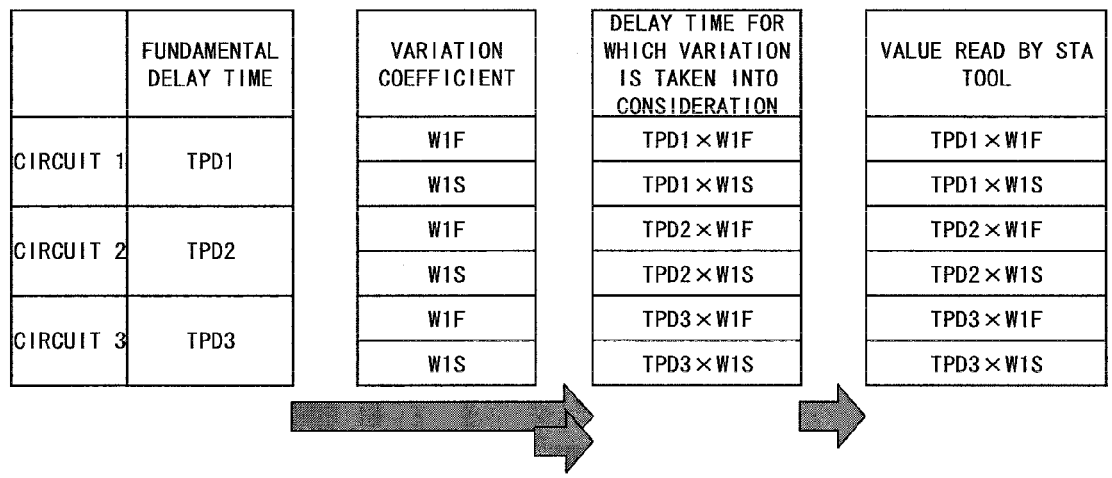
FIG. 17 shows a second example of data being relayed to the STA tool in a conventional design method.

Examples of data being relayed to the STA tool are explained by referring to FIGS. 14 through 17. FIGS. 14 and 15 show examples of data in the embodiment. FIGS. 16 and 17 show examples of data in a conventional method.

When the STA tool directly reads the fundamental delay time and the variation coefficients of the delay time as described above, the process in step S33 shown in FIG. 13 is not necessary. FIG. 14 shows an example of data being relayed to the STA tool in such a case. The fundamental delay times TDP 1 through TDP 3 for cells (such as inverter cells) constituting circuits 1 through 3 and variation coefficients of the delay times of the respective inverter cells such as the maximum value W1F and the minimum value W1S of the variation coefficients of the delay times for the inverter cells that constitute the circuit 1 are directly relayed to the STA tool. In the STA tool, the fundamental delay time is multiplied by each of the variation coefficients, and the results are processed as the values of the delay time.

FIG. 15 shows an example of data when the STA tool does not have a function of directly reading the fundamental delay time information 22 and the pair of delay time variation coefficients 23 in FIG. 13. As explained in step S33 shown in FIG. 13, in this case, the fundamental delay time for each cell and each of the variation coefficients of the delay time are multiplied, and the result has to be relayed to the STA tool.

FIGS. 16 and 17 show examples of data being relayed to the STA tool in a conventional design method as a comparison with FIGS. 14 and 15. FIG. 16 shows the case in which the STA tool has a function of directly reading variation coefficients or the like, and FIG. 17 shows the case in which the STA tool does not have such a function. Both cases are different from the embodiment in that the variation coefficients are not different from each other between the cells, and that the maximum value W1F and the minimum value W1S are relayed to all the cells.

The effects of the embodiment will be explained by referring to FIGS. 18 through 20. FIG. 18 shows the effect of margin reduction when the embodiment is applied. In FIG. 18, the margin reduction in the circuit to which an m-stage inverter is connected is explained. When the variation coefficient is smaller than the target value, i.e., on the high-speed side, the margin reduction amount is determined by the lower limitation value of the variation coefficients. In conventional methods, the value W1F of the lower limit of the variation coefficients is used, which does not depend on the gate width W of the transistor, and in the embodiment the margin reduction amount at the high-speed side is given by the equation below, which assumes that the respective m-stage inverter cells that actually constitute the circuit are constituted of the transistors having the gate width $W_4$.

$$TPD1 \times m \times (W4F - W1F)$$

where TPD0 represents the fundamental delay time.

Also, when obtaining the margin reduction amount at the low speed side, W1S of the upper limit value of the variation coefficients is used in conventional methods, and the margin reduction amount at the low-speed side is obtained by the equation below, which assumes that W4S is used in the embodiment.

$$TPD0 \times m \times (W1S - W4S)$$

In the above, W4F is greater than W1F as values of the variation coefficients, and W1S is greater than W4S; accordingly, the values of the margin reduction amounts both at the high-speed side and the low-speed side are positive values. Accordingly, it is possible to reduce the timing margin in the design phase.

Additionally, when the variation coefficient $W_4$ is used in a conventional method and the gate width in accordance with the cell that is to be actually used is $W_1$, the timing margin in the design phase is insufficient, and by using the variation coefficient $W_1$ in the embodiment, the insufficiency of the margin can be avoided.

Figure 20:
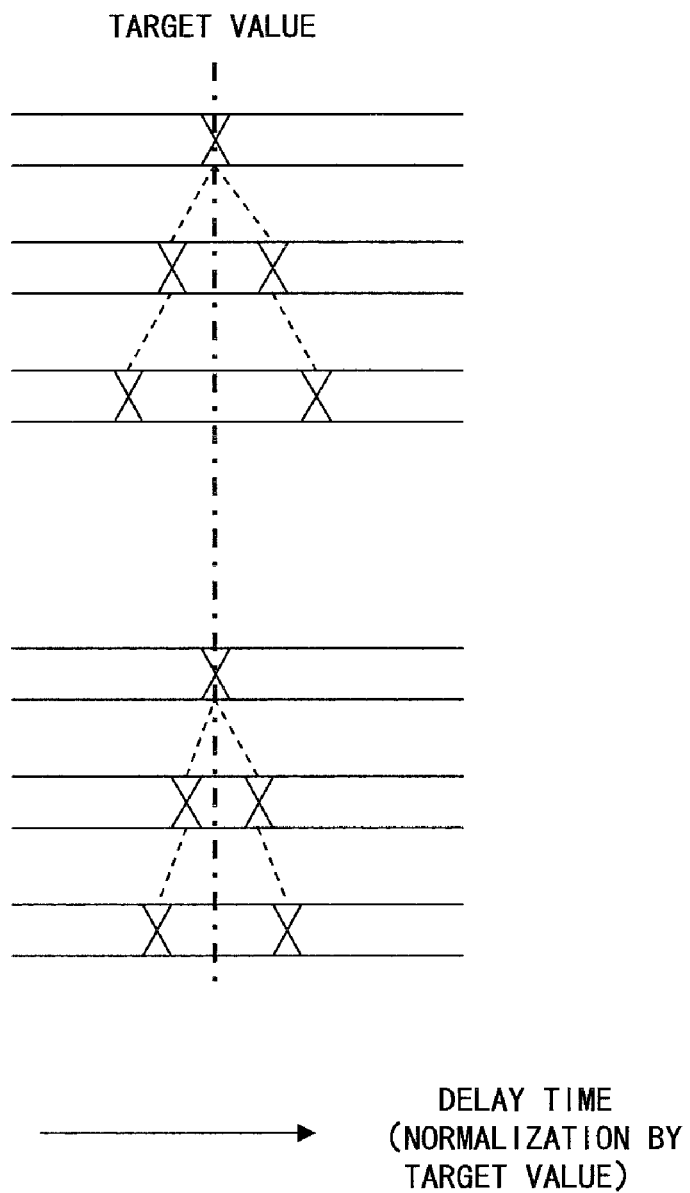
FIG. 20 is a second view showing the effect of delay time variation reduction in the embodiment.

FIGS. 19 and 20 show signal delay states, in the two-stage connection circuits of inverters, in a conventional method and in the embodiment. FIG. 19 shows the variations in the signal delay. FIG. 20 shows delay times when the variation is normalized on the basis of the target value. In both of the figures, the upper lines represent the cases of the conventional method and the lower lines represent the cases of the embodiment.

FIG. 19 shows W4S and W4F being used in the embodiment, and thereby variations of the delay time are smaller than in, for example, FIG. 18, in which W1S and W1F are used as the variation coefficients. In FIG. 20, the variation is small when being normalized on the basis of the target value. Because the variations are reduced, it is possible to reduce the timing margin.

In the above explanations, inverters are used for examples of functions of cells constituted of transistors. However, the functions of cells are not limited to inverters, and the embodiment can be applied to cells having any type of function.

The aforementioned embodiments allow the appropriate design of semiconductor integrated circuits and the development of a product that requires a higher operation speed by reducing timing margins on designs even when processes are miniaturized further and variations in the dimensions of transistors increase.

Other embodiments can be implemented as a semiconductor integrated circuit designed and produced using a method of designing a semiconductor integrated circuit according to any one of the above embodiments, and also can be implemented as a computer readable storage medium storing a program that causes a computer to execute a method of designing a semiconductor integrated circuit according to any one of the above embodiments.

What is claimed is:

1. A method of designing a semiconductor integrated circuit, comprising:
   using a computer, reading from a memory unit
      a fundamental property value of a cell constituting a semiconductor integrated circuit wherein variations of a property value are not taken into consideration for the fundamental property value, and
      a pair of variation coefficients among a plurality of pairs of variation coefficients wherein
         each pair in the plurality of pairs of variation coefficients is stored in the memory unit corresponding to one of a plurality of dimensions,
         each pair in the plurality of pairs of variation coefficients is constituted by an upper limit value of the variation coefficients and a lower limit value of the variation coefficients,
         the upper limit value and the lower limit value indicate a variation range of the property value, and
         the pair of variation coefficients to be read is one of the plurality of pairs of variation coefficients corresponding to a dimension of a transistor constituting the cell; and
   using the computer, performing a static timing analysis on the semiconductor integrated circuit in accordance with the read pair of variation coefficients and the fundamental property value,
   wherein the dimension of the transistor is a length or a width.

2. The method of designing a semiconductor integrated circuit according to claim 1, further comprising:
   using the computer, multiplying the upper limit value in the read pair of variation coefficients and the fundamental property value, and
   using the computer, multiplying the lower limit value in the read pair of variation coefficients and the fundamental property value, wherein
   the static timing analysis on the semiconductor integrated circuit is performed by the computer using property values based on the multiplications.

3. The method of designing a semiconductor integrated circuit according to claim 1, wherein:
   the property value of the cell is a delay time.

4. The method of designing a semiconductor integrated circuit according to claim 1, wherein:
   the dimension of the transistor is a gate width of the transistor.

5. A semiconductor integrated circuit designed and produced by using the method of designing a semiconductor integrated circuit according to claim 1.

6. A method of designing a semiconductor integrated circuit, comprising:
   using a computer, reading from a memory unit
      a fundamental property value of a cell constituting a semiconductor integrated circuit, and
      a pair of relational expressions constituted by
         a first relational expression that indicates relation between a dimension of a transistor constituting the cell and an upper limit of variation coefficients and
         a second relational expression that indicates relation between the dimension of the transistor and a lower limit of the variation coefficients;
   using the computer, calculating an upper limit value and a lower limit value of the variation coefficients of a property value of the cell by using the dimension of the transistor constituting the cell and the read pair of relational expressions; and
   using the computer, performing a static timing analysis on the semiconductor integrated circuit by using the calculated upper limit value, the calculated lower limit value, and the read fundamental property value,
   wherein the dimension of the transistor is a length or a width.

7. The method of designing a semiconductor integrated circuit according to claim 6, further comprising:
   using the computer, multiplying the calculated upper limit value and the read fundamental property value, and
   using the computer, multiplying the calculated lower limit value and the read fundamental property value, wherein
   the static timing analysis on the semiconductor integrated circuit is performed by the computer using property values based on the multiplications.

8. The method of designing a semiconductor integrated circuit according to claim 6, wherein:
   the read pair of relational expressions is a certain one pair in one or more pairs of functional expressions,
   each pair in the one or more pairs of functional expressions is stored in the memory unit corresponding to one of one or more intervals, and
   the certain one pair in the one or more functional expressions corresponds to a certain interval in which the dimension of the transistor constituting the cell is included.

9. The method of designing a semiconductor integrated circuit according to claim 6, wherein:
   the dimension of the transistor is a gate width of the transistor.

10. A non-transitory computer readable storage medium storing a semiconductor integrated circuit designing program, the program causing a computer to execute:
    reading from a memory unit
       a fundamental property value of a cell constituting a semiconductor integrated circuit wherein variations of a property value are not taken into consideration for the fundamental property value, and
       a pair of variation coefficients among a plurality of pairs of variation coefficients wherein
          each pair in the plurality of pairs of variation coefficients is stored in the memory unit corresponding to one of a plurality of dimensions,
          each pair in the plurality of pairs of variation coefficients is constituted by an upper limit value of the variation coefficients and a lower limit value of the variation coefficients, the upper limit value and the lower limit value indicate indicating a variation range of the property value, and the pair of variation coefficients to be read is one of the plurality of pairs of variation coefficients corresponding to a dimension of a transistor constituting the cell; and performing a static timing analysis on the semiconductor integrated circuit in accordance with the read pair of variation coefficients and the fundamental property value, wherein the dimension of the transistor is a length or a width.

11. A non-transitory computer readable storage medium storing a semiconductor integrated circuit designing program, the program causing a computer to execute:

reading from a memory unit
- a fundamental property value of a cell constituting a semiconductor integrated circuit wherein variations of a property value are not taken into consideration for the fundamental property value, and
- a pair of variation coefficients among a plurality of pairs of variation coefficients wherein
  each pair in the plurality of pairs of variation coefficients is stored in the memory unit corresponding to one of a plurality of dimensions,
  each pair in the plurality of pairs of variation coefficients is constituted by an upper limit value of the variation coefficients and a lower limit value of the variation coefficients,
  the upper limit value and the lower limit value indicate a variation range of the property value, and
  the pair of variation coefficients to be read is one of the plurality of pairs of variation coefficients corresponding to a dimension of a transistor constituting the cell;

multiplying the upper limit value in the read pair of variation coefficients and the fundamental property value;

multiplying the lower limit value in the read pair of variation coefficients and the fundamental property value; and performing a static timing analysis on the semiconductor integrated circuit in accordance with property values based on the multiplications, wherein the dimension of the transistor is a length or a width.

* * * * *